(12) United States Patent
Goto et al.

(10) Patent No.: US 11,476,138 B2
(45) Date of Patent: Oct. 18, 2022

(54) DIAGNOSTIC SYSTEM OF SUBSTRATE TRANSFER HAND

(71) Applicant: KAWASAKI JUKOGYO KABUSHIKI KAISHA, Kobe (JP)

(72) Inventors: Hirohiko Goto, Akashi (JP); Tetsuya Yoshida, Kakogawa (JP); Haruhiko Tan, Kobe (JP); Kazuo Fujimori, Akashi (JP); Katsuhiro Yamashita, Kakogawa (JP); Masahiko Sumitomo, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 847 days.

(21) Appl. No.: 16/337,856

(22) PCT Filed: Sep. 21, 2017

(86) PCT No.: PCT/JP2017/034016
§ 371 (c)(1),
(2) Date: Mar. 28, 2019

(87) PCT Pub. No.: WO2018/061957
PCT Pub. Date: Apr. 5, 2018

(65) Prior Publication Data
US 2020/0027765 A1    Jan. 23, 2020

(30) Foreign Application Priority Data
Sep. 28, 2016   (JP) .............................. JP2016-189150

(51) Int. Cl.
*H01L 21/67* (2006.01)
*G06T 7/13* (2017.01)
(Continued)

(52) U.S. Cl.
CPC ...... *H01L 21/67288* (2013.01); *B65G 47/905* (2013.01); *G06T 7/001* (2013.01);
(Continued)

(58) Field of Classification Search
CPC ........ G05B 2219/39055; G05B 19/404; G03B 2219/40589; G06T 7/74; G06T 7/70; G06T 7/13; H01L 21/67288; H01L 21/677
See application file for complete search history.

(56) References Cited

U.S. PATENT DOCUMENTS

| 6,414,711 B2 * | 7/2002 | Arimatsu ............... G05B 19/42 348/130 |
| 2001/0010539 A1 | 8/2001 | Arimatsu et al. |

(Continued)

FOREIGN PATENT DOCUMENTS

| JP | H09-070780 A | 3/1997 |
| JP | 2006-120820 A | 5/2006 |

(Continued)

*Primary Examiner* — Alia Sabur
(74) *Attorney, Agent, or Firm* — Oliff PLC

(57) ABSTRACT

A diagnostic system of a substrate transfer hand including a base part coupled to a hand tip portion of a robot arm and a substrate holding part coupled to the base part to hold a substrate, includes a camera which is secured to the base part and takes an image of the substrate holding part; and a diagnostic device which obtains image information of the image taken by the camera and diagnoses normality of the substrate holding part based on the image information.

6 Claims, 5 Drawing Sheets

(51) Int. Cl.
  *G06T 7/70* (2017.01)
  *B65G 47/90* (2006.01)
  *G06T 7/00* (2017.01)
  *H01L 21/677* (2006.01)
  *H04N 5/225* (2006.01)

(52) U.S. Cl.
  CPC ............... *G06T 7/13* (2017.01); *G06T 7/70* (2017.01); *H01L 21/677* (2013.01); *H04N 5/2253* (2013.01); *G06T 2207/30148* (2013.01); *G06T 2207/30244* (2013.01)

(56) References Cited

U.S. PATENT DOCUMENTS

2004/0199361 A1* 10/2004 Lu .................... G05B 19/41875
  702/183
2016/0279800 A1* 9/2016 Onda .................... B25J 9/1692
2018/0015620 A1 1/2018 Nakaya et al.
2018/0082879 A1* 3/2018 Jung ................ H01L 21/67259

FOREIGN PATENT DOCUMENTS

| JP | 2006120820 A | * | 5/2006 |
| JP | 2010-076054 A | | 4/2010 |
| WO | 2016/103292 A1 | | 6/2016 |

\* cited by examiner

DIAGNOSTIC SYSTEM OF SUBSTRATE TRANSFER HAND

TECHNICAL FIELD

The present invention relates to a diagnostic system which diagnoses normality (correctness) of a substrate transfer hand which holds and transfers substrates such as semiconductor wafers or glass substrates.

BACKGROUND ART

Conventionally, substrate treatment equipment which performs process treatments such as element formation to semiconductor substrates (hereinafter will also be referred to as "substrates") which are semiconductor device manufacturing materials, is known. Typically, in the substrate treatment equipment, a process treatment device and a substrate transfer and loading device (device for transferring and loading substrates) located adjacently to the process treatment device are placed.

Typically, the substrate transfer and loading device includes a casing (housing) formed with a transfer room in an inside thereof, a plurality of load ports provided at the front wall of the casing, and a substrate transfer robot placed inside the transfer room. The substrate transfer robot includes a robot arm, and a substrate transfer hand coupled to the hand tip portion of the robot arm. This substrate transfer robot performs work operations such as loading and unloading the substrate to and from the process treatment device, taking the substrate out of a substrate carrier docked to the load port, and accommodating the substrate into the substrate carrier.

For example, as disclosed in Patent Literature 1, the substrate transfer hand including a base part coupled to the hand tip portion of the robot arm and a substrate holding (retaining) part coupled to this base part, is widely used. The substrate transfer hand disclosed in Patent Literature 1 is attached with a monitoring camera and an obstacle detecting sensor, in a region other than a thin substrate placement region of the hand.

CITATION LIST

Patent Literature

Patent Literature 1: Japanese Laid-Open Patent Application Publication No. 2006-120820

SUMMARY OF INVENTION

Technical Problem

The substrate holding part of the substrate transfer hand is very thin so that the substrate holding part can be inserted into a very narrow space of a substrate carrier. For example, the substrate holding part on which the substrate can be placed is a very thin plate member made of a resin such as a PEEK resin. While this substrate holding part is transferring the substrate, it may collide with an obstacle (e.g., substrate carrier or a constituent of the process treatment device). In a case where an impact is applied to the thin substrate holding part, it is deformed to diffuse impact energy. It is difficult for the deformed substrate holding part to accurately transfer the substrate unless it is corrected.

Solution to Problem

The deformation of the substrate holding part of the substrate transfer hand sometimes occurs due to a load applied from the substrate being transferred, deterioration, or the like, as well as the collision. In view of this, the inventors of the present application took an image of the substrate holding part of the substrate transfer hand and monitored a condition of the substrate holding part by use of the image (or video picture).

In the technique disclosed in Patent Literature 1, the obstacle detecting sensor attached on the substrate transfer hand detects the obstacle which is about to collide with the hand, the operation of the hand is stopped before the hand actually collides with the obstacle, and the image taken by the monitoring camera is utilized to investigate a cause of the stop. However, in the technique disclosed in Patent Literature 1, the image of the tip end portion of the substrate transfer hand is taken by the monitoring camera, but is not used to monitor the condition of the substrate transfer hand.

According to an aspect of the present invention, there is provided a diagnostic system of a substrate transfer hand including a base part coupled to a hand tip portion of a robot arm and a substrate holding part coupled to the base part to hold a substrate, the diagnostic system comprising: a camera which is secured to the base part and takes an image of the substrate holding part; and a diagnostic device which obtains image information of the image taken by the camera and diagnoses normality (correctness) of the substrate holding part based on the image information.

In accordance with this diagnostic system, the normality of the substrate holding part is determined by using the image of the substrate holding part. This makes it possible to more accurately and specifically know the condition of the substrate holding part, than in a case where a displacement sensor of a contact or non-contact type is used. In addition, the diagnostic system can diagnose the normality of the substrate holding part without an operator in a closed transfer room.

ADVANTAGEOUS EFFECTS OF INVENTION

In accordance with the present invention, it is possible to provide a diagnostic system of a substrate transfer hand which makes it possible to more accurately and specifically know the condition of a substrate holding part.

DESCRIPTION OF EMBODIMENTS

Figure 1:
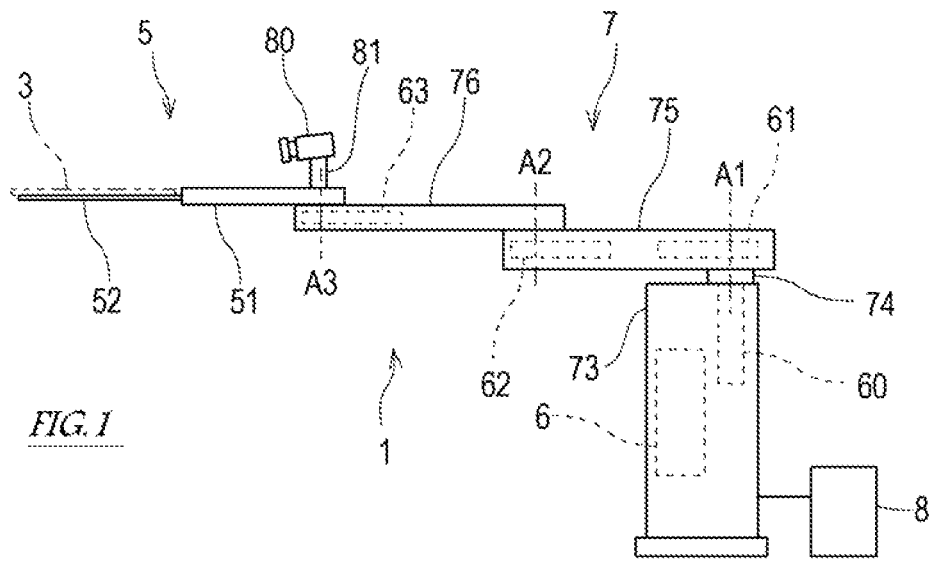
FIG. 1 is a schematic side view of a substrate transfer robot including a substrate transfer hand according to an embodiment of the present invention.

Hereinafter, the embodiment of the present invention will be described with reference to the drawings. FIG. 1 is a schematic side view of a substrate transfer robot 1 including a substrate transfer hand 5 according to an embodiment of the present invention.

Configuration of Substrate Transfer Robot 1

As shown in FIG. 1, the substrate transfer robot 1 includes a base 73, a robot arm (hereinafter will be simply referred to as "arm 7") supported by the base 73 so that the arm 7 is rotatable and movable up and down with respect to the base 73, the substrate transfer hand (hereinafter will be simply referred to as "hand 5") coupled to the hand tip portion of the arm 7, and a controller 6 which controls the operation of the substrate transfer robot 1.

In the present embodiment, the arm 7 is a horizontal articulated (multi-joint) arm. The arm 7 includes a plurality of links 75, 76 coupled to each other in turn from its base end portion toward its tip end portion. Regarding the arm 7 and the hand 5, an end portion which is close to the base 73 will be referred to as "base (proximal) end portion", and an end portion which is distant from the base 73 will be referred to as "tip (distal) end portion". Joint axis lines A1 to A3 perpendicular to the coupling portions of links 75, 76 are defined in the arm 7. Inside the links 75, 76, driving units 61, 62, 63 are provided to independently displace the links 75, 76 and the hand 5 around the joint axis lines A1 to A3.

The base end portion of the arm 7 is coupled to an up-down shaft 74 supported by the base 73 so that the up-down shaft 74 is vertically extendable and contractible. A driving unit 60 causes the up-down shaft 74 to be extended and contracted with respect to the base 73.

The hand 5 is coupled to the hand tip portion which is the tip end portion of the arm 7 with the above-described configuration. By the operation of the driving unit 63, the hand 5 is rotatable relative to the tip end portion of the arm around the joint axis line A3.

Figure 2:
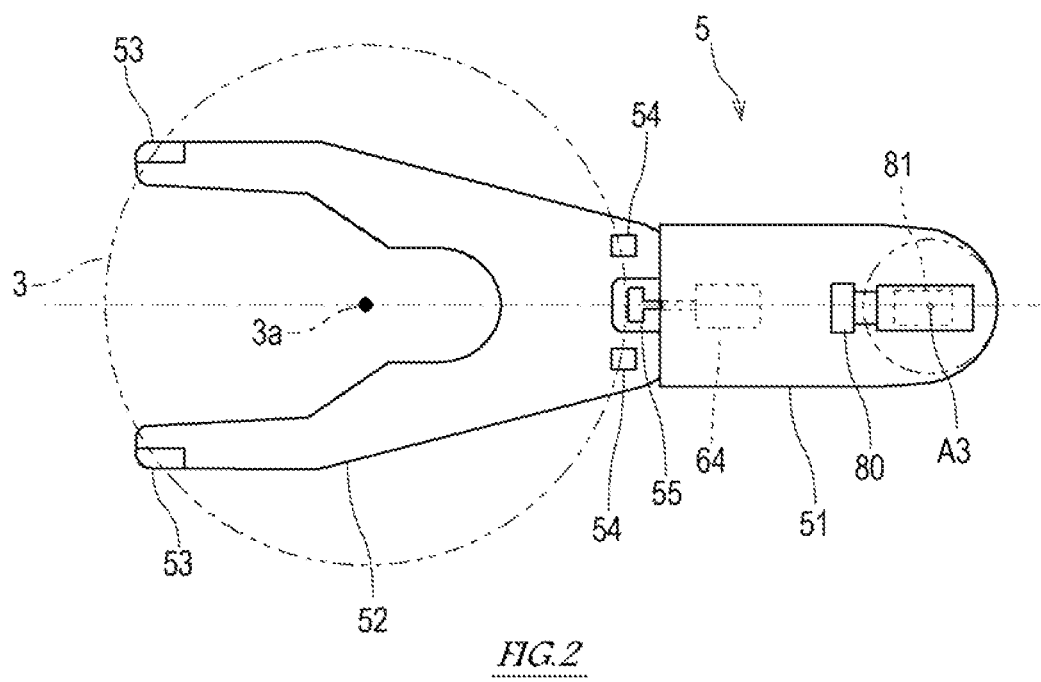
FIG. 2 is a plan view of the substrate transfer hand.

FIG. 2 is a plan view of the substrate transfer hand 5. As shown in FIG. 2, the hand 5 includes a base part 51 and a substrate holding part 52.

The base part 51 is formed by a hollow casing. The base end portion of the base part 51 is coupled to the hand tip portion of the arm 7 so that the base part 51 is rotatable around the joint axis line A3. The base end portion of the substrate holding part 52 is coupled to the tip end portion of the base part 51.

The substrate holding part 52 is a thin plate member with a Y-shape having forked portions at its tip end side. The substrate holding part 52 is also referred to as a blade or a fork. The configuration of the substrate holding part 52 is not limited to that of the present embodiment. The substrate holding part 52 may have any configuration so long as the substrate holding part 52 is capable of holding the substrate 3 by the hand 5 by, for example, fitting, adsorption, sandwiching, or other means.

The forked tip end portions of the substrate holding part 52 are provided with a pair of front guides 53, respectively. The base end portion of the substrate holding part 52 is provided with a pair of rear guides 54 corresponding to the pair of front guides 53, respectively. The pair of front guides 53 and the pair of rear guides 54 serve to support the substrate 3 from the underside.

The hand 5 further includes a holding (retaining) mechanism for allowing the substrate 3 to be held by the substrate holding part 52. Holding the substrate 3 includes holding the substrate 3 placed on the substrate holding part 52 while preventing the substrate 3 from being disengaged from the substrate holding part 52 by, for example, fitting, adsorption, sandwiching, or other means. In the present embodiment, the hand 5 includes a holding mechanism for holding the substrate 5 by sandwiching. This holding mechanism includes the pair of front guides 53, a pusher 55, and a driving mechanism 64 for driving the pusher 55.

The pusher 55 is provided at the base end side of the substrate holding part 52 and supported by the base part 51. The driving mechanism 64 of the pusher 55 is provided inside the base part 51. The driving mechanism 64 is constituted by, for example, an actuator such as an air cylinder. A "hand center line C" passing through the joint axis line A3 and a center point 3a of the substrate 3 held by the substrate holding part 52, when viewed from above (in a top plan view), is defined in the hand 5. When viewed from above (in a top plan view), the pusher 55 is disposed on the hand center line C. The driving mechanism 64 advances and retracts the pusher 55 in parallel with the hand center line C.

When the substrate 3 is placed on the upper surface of the substrate holding part 52, the peripheral edge of the substrate 3 is supported from the underside by the pair of front guides 53 and the pair of rear guides 54. In this state, the pusher 55 is advanced toward the tip end of the substrate holding part 52, and pushes the side surface of the substrate 3 to the pair of front guides 53. In this way, the substrate 3 is gripped by the pusher 55 and the pair of front guides 53, and is held by the hand 5.

Figure 3:
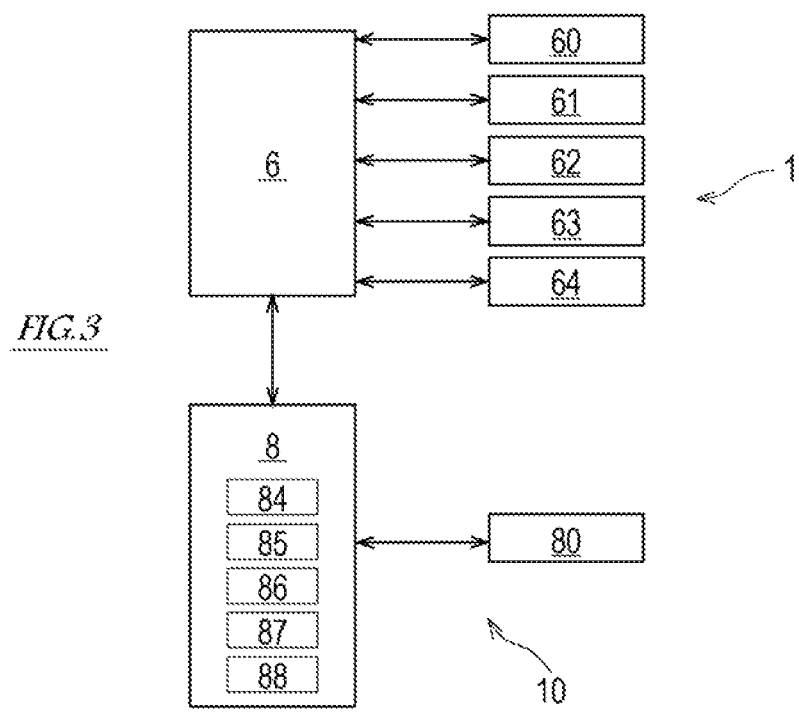
FIG. 3 is a block diagram showing the configuration of a diagnostic system of the substrate transfer hand and the configuration of a control system of the substrate transfer robot.

FIG. 3 is a block diagram showing the configuration of a diagnostic system 10 of the substrate transfer hand 5 and the configuration of a control system of the substrate transfer robot 1. As shown in FIG. 3, the controller 6 is electrically connected to the driving units 60, 61, 62, 63 for driving the joints of the substrate transfer robot 1, the driving mechanism 64 of the pusher 55 of the substrate transfer hand 5, and the like, and is configured to control the operations of the driving units 60, 61, 62, 63, 64. Each of the driving units 60, 61, 62, 63 includes, for example, a servo motor which is angularly displaced in response to a signal provided by the controller 6, a driving force transmission mechanism which transmits a driving force of the servo motor to a link, and a position detector which detects an angular displacement of the servo motor (the servo motor, the driving force transmission mechanism, and the position detector are not shown in the drawings).

The controller 6 is a calculation (computation) control device including a computer. For example, the controller 6 includes a processor such as a microcontroller, CPU, MPU, PLC, DSP, ASIC or FPGA, and a storage section such as ROM or RAM (these are not shown). The storage section contains therein programs executed by the processor, fixed data, and the like. In addition, the storage section contains therein teaching point data used to control the operation of the substrate transfer robot 1, shape and dimension data of the arm 7 and the hand 5, shape and dimension data of the substrate 3 held by the hand 5, and the like. The processor of the controller 6 reads out software such as the programs stored in the storage section and executes the software, to perform processing used to control the operation of the substrate transfer robot 1. The controller 6 may be a single computer which performs a centralized control to execute processing or may be a plurality of computers which perform a distributed control to perform the processing.

The controller 6 calculates (computes) a target pause of the hand 5 after a passage of a predetermined control time, based on a pause (position and posture) of the hand 5 corresponding to a rotation position detected by each position detector and the teaching point data stored in the storage section. Then, the controller 6 outputs control commands to servo amplifiers so that the hand 5 takes the target pause after a passage of the predetermined control time. In response to the control commands, the servo amplifiers supply driving electric power to the servo motors, respectively. In this way, the hand 5 can be moved to take a desired pause.

Diagnostic System 10

Next, the diagnostic system 10 which diagnoses the condition of the hand 5 will be described. As shown in FIGS. 1 to 3, the diagnostic system 10 includes a camera 80 attached on the hand 5, and a diagnostic device 8 which obtains image information of the image taken by the camera and diagnoses normality (correctness) of the substrate holding part 52 of the hand 5 based on the image information.

The camera 80 may be, for example, a CCD camera. The camera 80 is attached on a camera seat 81 secured onto the base part 51 of the hand 5. The camera 80 supported on the camera seat 81 is disposed at a location of the base end portion of the base part 51 of the hand 5, the location overlapping with the hand center line C.

Figure 4:
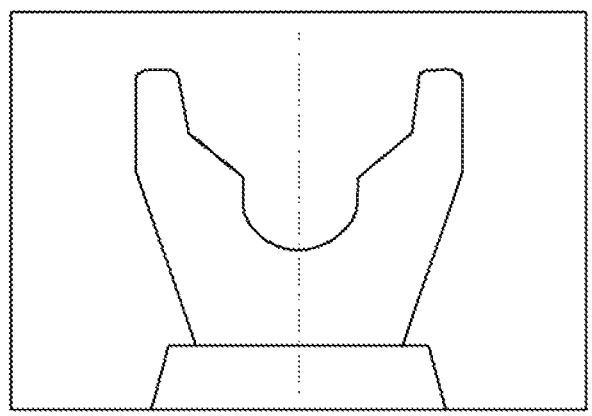
FIG. 4 is a view showing an example of an image taken by a camera.

FIG. 4 is a view showing an example of the image taken by the camera 80. As shown in FIG. 4, the image taken by the camera 80 includes the tip end portion of the base part 51 of the hand 5 and the whole of the substrate holding part 52, which are viewed from above and the base end portion of the hand 5. Desirably, the center of the image taken by the camera 80 and the hand center line C conform to each other. The mounting angle and position of the camera 80 with respect to the camera seat 81 are adjusted so that the tip end portion of the base part 51 of the hand 5 and whole of the substrate holding part 52 are included in a range of a target object whose image is to be taken by an imaging sensor of the camera 80.

The diagnostic device 8 is a calculation (computation) control device including a computer. The diagnostic device 8 includes a processor such as a microcontroller, CPU, MPU, PLC, DSP, ASIC or FPGA, and a storage section such as ROM or RAM (these are not shown).

Figure 6:
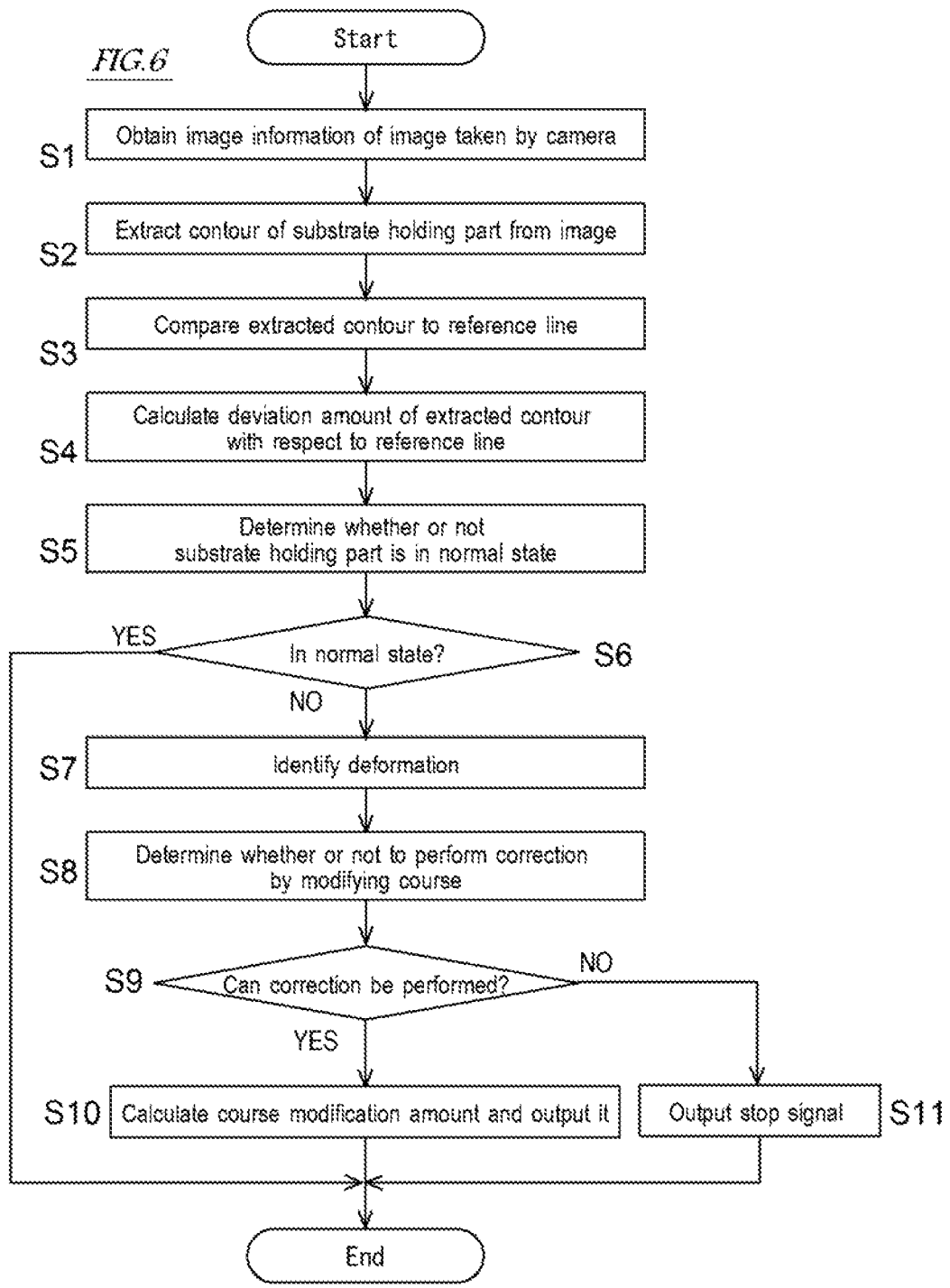
FIG. 6 is a view for explaining a flow of a diagnostic process performed by the diagnostic device.

The diagnostic device 8 includes functional sections which are an image processing section 84, a comparison section 85, a normality determination section 86, a deformation identification section 87 and a course modification (correction) section 88. The processor of the diagnostic device 8 reads out the software such as the programs stored in the storage section and executes the software, to perform processing as the functional sections. The diagnostic device 8 may be a single computer which performs a centralized control to execute processing or may be a plurality of computers which perform a distributed control to perform the processing. Hereinafter, a flow of the diagnostic process performed by the diagnostic device 8 and the functions of the functional sections will be described with reference to FIG. 6.

Initially, the diagnostic device 8 obtains the image information of the image taken by the camera 80 (step S1). The image processing section 84 executes predetermined image processing to this image information to extract a contour of the base part 51 and a contour of the substrate holding part 52, from the image (step S2). In a case where a change in the posture of the camera 80 which will be described later is not diagnosed, the image processing section 84 may extract only the contour of the substrate holding part 52.

The comparison section 85 reads an image (reference image) of a reference line pre-stored in the storage section, and compares the image of the contour extracted by the image processing section 84 to the reference image (step S3) to extract a change between these images. The reference line is defined as the contour extracted by performing the image processing to the image of the substrate holding part 52 in a normal (correct) state which is taken by the camera 80 in advance. In brief, the image of the reference line is an image of the contour of the substrate holding part 52 in the normal (correct) state. The range of the image taken by the camera 80 is the same between a case where the reference line is created and a case where the present diagnostic process is performed. In a case where the substrate holding part 52 is in the normal state, the reference line and the extracted contour conform to each other. Note that the contour may be extracted and the change between the two images may be extracted, by known means.

Figure 5:
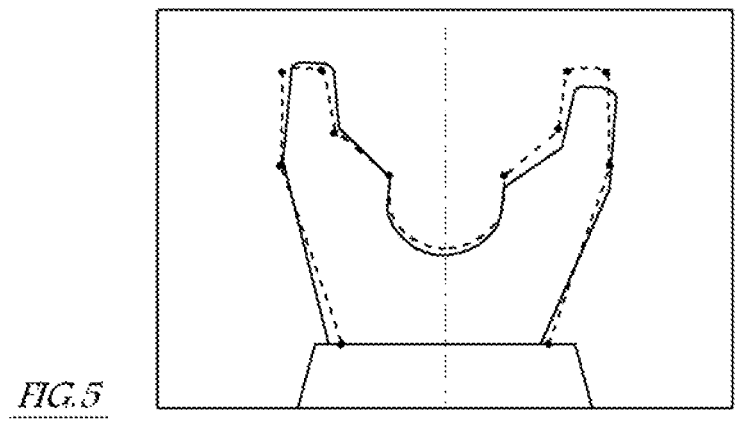
FIG. 5 is a view showing a content of the image processed by a diagnostic device.

FIG. 5 schematically shows the image taken by the camera 80. In FIG. 5, the contour extracted from the image taken by the camera 80 is indicated by a solid line, and the reference line is indicated by a chained line. In the example shown in FIG. 5, the extracted contour of the base part 51 and the reference line conform to each other, whereas the extracted contour of the substrate holding part 52 and the reference line do not conform to each other (there is a deviation between the extracted contour of the substrate holding part 52 and the reference line).

The comparison section 85 calculates a deviation amount of the extracted contour with respect to the reference line, for each of a plurality of characteristic points pre-defined in the reference line (step S4). For example, as indicated by black points of FIG. 5, the characteristic points may be defined as end points of the reference line and points at which line inclination rapidly changes. For example, the deviation amount is represented by a vector from the characteristic point of the reference line to a point on the extracted contour corresponding to this characteristic point.

The normality determination section 86 determines whether or not there is a change in the position of the camera 80 with respect to the base part 51 and whether or not the substrate holding part 52 is in the normal state, based on the plurality of deviation amounts calculated by the comparison section 85 (step S5). Note that the change in the position of the camera 80 with respect to the base part 51 includes a change in the posture of the camera 80 with respect to the base part 51.

The normality determination section 86 firstly determines whether or not there is a change in the position of the camera 80 with respect to the base part 51, based on the deviation amounts of the extracted contour of the base part 51 with respect to the reference line. For example, in a case where all of the deviation amounts are within a predetermined threshold, the normality determination section 86 may determine that there is no change in the position of the camera 80 with respect to the base part 51 (the position of the camera 80 has changed with respect to the base part 51). In other cases, the normality determination section 86 may determine that there is a change in the position of the camera 80 with respect to the base part 51. The position and posture of the camera 80 with respect to the base part 51 are fixed. However, if the camera 80 collides with, for example, an obstacle, at least one of the position and posture of the camera 80 with respect to the base part 51 may be changed. In view of this, the normality determination section 86 firstly determines whether or not there is a change in the position of the camera 80 with respect to the base part 51. This makes it possible to confirm that the normality of the substrate holding part 52 can be properly determined. In a case where the normality determination section 86 determines that there is a change in the position of the camera seat 81 with respect to the base part 51, the normality determination section 86 may output an error signal and terminate the processing, without determining whether or not the substrate holding part 52 is in the normal state, as will be described later.

Then, the normality determination section 86 determines whether or not the substrate holding part 52 is in the normal state, based on the deviation amounts of the extracted contour of the substrate holding part 52 with respect to the reference line. For example, in a case where all of the deviation amounts are within a predetermined threshold, the normality determination section 86 may determine that the substrate holding part 52 is in the normal (correct) state. In other cases, the normality determination section 86 may determine that the substrate holding part 52 is not in the normal state (has an abnormality). Also, for example, in a case where a preset number of deviation amounts, of the plurality of deviation amounts, are larger than the predetermined threshold, the normality determination section 86 determines that the substrate holding part 52 is not in the normal state. In other cases, the normality determination section 86 may determine that the substrate holding part 52 is in the normal state. The diagnostic device 8 may output a result of the determination of the normality to, for example, an output unit such as a monitor.

In a case where the normality determination section 86 determines that the substrate holding part 52 is not in the normal state (NO in step S6), the deformation identification section 87 identifies a deformation occurring in the substrate holding part 52 based on the plurality of deviation amounts (step S7). The deformation occurring in the substrate holding part 52 includes, for example, a twist, an in-plane inclination, a partial distortion, an out-of-plane warpage, or the like. The storage section contains therein data, formulas, or models which associate trends of the plurality of deviation amounts with the deformations, respectively. By using this, the deformation identification section 87 identifies one from among the plurality of deformations based on the plurality of deviation amounts. The diagnostic device 8 may output the identified deformation to, for example, the output unit such as the monitor.

The course modification section 88 determines whether or not to perform correction by modifying the course of the hand 5, based on the identified deformation and the plurality of deviation amounts (step S8). Note that the course of the hand 5 is preset in the controller 6 by teaching.

In principle, whether or not to perform the correction by modifying the course is decided depending on the identified deformation. For example, in a case where the deformation is the twist or the out-of-plane warpage, the correction of the hand 5 cannot be performed by modifying the course of the hand 5. For this reason, it is desirable to stop the hand 5. On the other hand, for example, in a case where the deformation is the in-plane inclination or the partial distortion, there is a possibility that the substrate 3 can be properly transferred by modifying the course of the hand 5. However, even in a case where the deformation is the in-plane inclination or the partial distortion, the correction of the hand 5 cannot be performed by modifying the course and the hand 5 should be stopped if the deviation amounts are large. The storage section contains therein data, formulas, or models which associate the deformations, the deviation amounts and whether or not to perform the correction by modifying the course, with each other. By using this, the course modification section 88 determines whether or not to perform the correction by modifying the course of the hand 5. The diagnostic device 8 may output a result indicating whether or not to perform the correction by modifying the course to, for example, the output unit such as the monitor.

In a case where the course modification section 88 determines that the correction can be performed (YES in step S9), the course modification section 88 calculates a course modification amount based on the deformation and the deviation amounts (step S10). The diagnostic device 8 outputs the calculated course modification amount to the controller 6 which is a control unit of the arm 7. The controller 6 modifies the course set by the teaching, based on the course modification amount, and operates the arm 7 so that the hand 5 is moved along the modified course.

On the other hand, in a case where the course modification section 88 determines that the correction cannot be performed (NO in step S9), the course modification section 88 outputs a stop signal to the controller 6 (step S11). Receiving the stop signal, the controller 6 stops the operation of the arm 7.

As described above, the diagnostic device 8 monitors the condition of the hand 5, in particular, the substrate holding part 52. Note that the diagnostic device 8 performs the diagnostic process to the hand 5 at timings when the substrate 3 is not placed on the substrate holding part 52. For example, the diagnostic device 8 may perform the diagnostic process to the hand 5, during maintenance or a timing when a transfer cycle is started or ended.

As described above, the diagnostic system 10 of the substrate transfer hand 5 according to the present embodiment includes the camera 80 which is secured to the base part 51 of the substrate transfer hand 5 and takes an image of the substrate holding part 52, and the diagnostic device 8 which obtains the image information of the image taken by the camera 80 and diagnoses the normality of the substrate holding part 52 (whether or not the substrate holding part 52 is in the normal state) based on the image information.

The diagnostic device 8 according to the present embodiment extracts from the image information, for example, the contour of the substrate holding part 52 which is contained in the image, compares the extracted contour to the normal (correct) contour (namely, reference line) pre-stored, and determines whether or not the substrate holding part is in the normal state, based on the deviation amounts of the extracted contour with respect to the normal contour.

In accordance with the diagnostic system 10, the normality of the substrate holding part 52 is determined by using the image of the substrate holding part 52. This makes it possible to more accurately and specifically know the condition of the substrate holding part 52, than in a case where a displacement sensor of a contact or non-contact type is used. In addition, the diagnostic system 10 can diagnose the normality of the substrate holding part 52, without an operator, for example, in a closed transfer room of a substrate transfer and loading device (device for transferring and loading the substrate).

In the present embodiment, in a case where the diagnostic device 8 determines that the substrate holding part 52 is not in the normal state, it selects (chooses) one from among the pre-stored deformations, based on the deviation amounts.

This makes it possible to identify the deformation of the substrate holding part 52, in a case where the deformation occurs in the substrate holding part 52 of the hand 5. Then, proper processing corresponding to the deformation can be performed.

In the present embodiment, the diagnostic device 8 determines whether or not to perform the correction by modifying the course of the substrate transfer hand 5, based on the deformation and the deviation amounts. Then, in a case where the correction can be performed, the diagnostic device 8 calculates the course modification amount, and outputs this to the control unit (controller 6) of the robot arm 7. In a case where the correction cannot be performed, the diagnostic device 8 outputs the stop signal to the control unit (controller 6) of the robot arm 7.

Thus, in a case where the correction can be performed by modifying the course of the hand 5, the substrate transfer robot 1 can continue the work operation without stop.

In the present embodiment, the camera 80 takes the image of a portion of the base part 51 in addition to the substrate holding part 52. Then, the diagnostic device 8 extracts the contour of the base part 51 which is contained in the image information, compares the image of the extracted contour of the base part 51 to the image of the contour of the base part 51 in the normal state which is pre-stored, to extract a change between these images, and determines whether or not there is a change in the positon of the camera 80 with respect to the base part 51, based on the extracted change between the images. Note that the change in the positon of the camera 80 with respect to the base part 51 includes a change in the posture of the camera 80 with respect to the base part 51.

Since the diagnostic device 8 determines whether or not there is a change in the positon of the camera 80 with respect to the base part 51, whether or not the diagnostic system 10 can properly perform the diagnostic process to the substrate holding part 52 can be found.

The preferred embodiment of the present invention has been described above. The present invention may include modifications of the details of the specific structure and/or function of the embodiment, within the scope of the invention. The configurations may be modified as follows.

For example, in the above-described embodiment, the diagnostic device 8 performs the diagnostic process to the substrate 3 by using the image taken by the camera 80. Alternatively, the diagnostic device 8 may perform the diagnostic process to the substrate 3 by using a video picture taken by the camera 80.

Although in the above-described embodiment, the controller 6 and the diagnostic device 8 are independent of each other, a function of the diagnostic device 8 may be incorporated into the controller 6.

For example, in the above-described embodiment, the diagnostic device 8 extracts the change between the image of the base part 51 of the hand 5 which is contained in the image information and the pre-stored image of the base part 51 in the normal state and the change between the image of the substrate holding part 52 of the hand 5 which is contained in the image information and the pre-stored image of the substrate holding part 52 in the normal state, by using the image of the contour of the base part 51 which is contained in the image information and the image of the contour of the substrate holding part 52 which is contained in the image information. However, the extraction of the change between the images based on the images of the contour is exemplary. For example, an area of a particular color contained in the image information of the image taken by the camera 80 may be extracted, and the change between the images may be extracted by comparing this area to a pre-stored area (reference image) of the particular color of the substrate holding part 52 in the normal state. For example, markers may be given in advance to the base part 51 and the substrate holding part 52, and the change between the images may be extracted by comparing an image of the marker of the base part 51 which is contained in the image information of the image taken by the camera 80 to a pre-stored image (reference image) of the marker of the base part 51 in the normal state and comparing an image of the marker of the substrate holding part 52 which is contained in the image information of the image taken by the camera 80 to a pre-stored image (reference image) of the marker of the substrate holding part 52 in the normal state.

Figure 7:
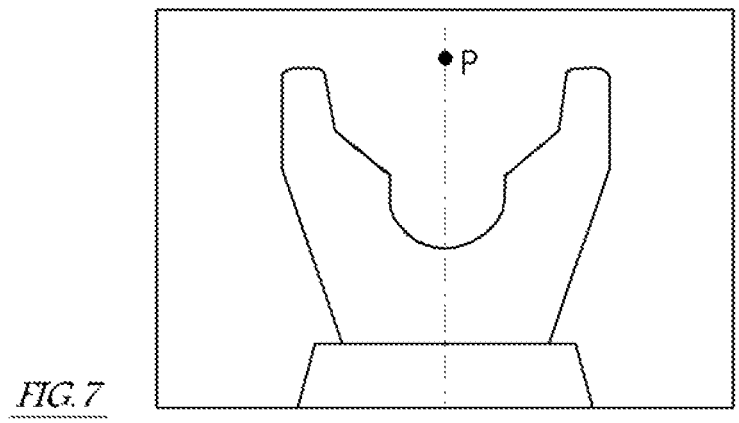
FIG. 7 is a view showing an example of the image including a reference point and a substrate holding part.

For example, although in the above-described embodiment, the change in the position of the camera 80 with respect to the base part 51 is detected by using the image of the base part 51 of the hand 5, the change in the position of the camera 80 with respect to the base part 51 may be detected by utilizing a region other than the base part 51, as will be described below. For example, a reference point P may be pre-defined by marking or the like in a region other than the hand 5, and the camera 80 may take an image of the substrate holding part 52 within a range including this reference point P. The image information taken in this way includes, for example, the image of the reference point P and the substrate holding part 52, as shown in FIG. 7. In every diagnostic process, the camera 80 takes the image of the hand 5 in a specified location and with a specified posture. In a case where the position of the camera 80 with respect to the base part 51 is not deviated (unvaried), the reference point P exists in a predetermined location in a view range of the camera 80. The diagnostic device 8 compares the image of the reference point P and the substrate holding part 52 to the image (reference image) of the reference point P and the substrate holding part 52 which are in the normal state, to extract a change between these images (deviation amount of the reference point P), and determines whether or not there is a change in the position of the camera with respect to the base part 51 based on the extracted change.

REFERENCE SIGNS LIST 1 substrate transfer robot
3 substrate
3a center point
5 substrate transfer hand
6 controller
7 arm
8 diagnostic device
10 diagnostic system
51 base part
52 substrate holding part
53 front guide
54 rear guide
55 pusher
60 to 63 driving unit
64 driving mechanism
73 base
74 up-down shaft
75 link
76 link
80 camera
81 camera seat
84 image processing section
85 comparison section
86 normality determination section
87 deformation identification section
88 course modification section
A1 to A3 joint axis line
C hand center line

The invention claimed is:
1. A diagnostic system of a substrate transfer hand including a base part coupled to a hand tip portion of a robot arm and a substrate holding part coupled to the base part to hold a substrate, the diagnostic system comprising:
- a camera which is secured to the base part and takes an image containing the substrate holding part and a portion of the base part; and
- a diagnostic device which obtains image information of the image taken by the camera and diagnoses normality of the substrate holding part based on the image information,
- wherein the diagnostic device extracts an image of the base part which is contained in the image information, compares the extracted image of the base part to a pre-stored image of the base part in a normal state, to extract a change between the extracted image and the pre-stored image, and determines whether or not there is a change in a position of the camera mounted on the hand with respect to the base part of the hand based on the extracted change.

2. The diagnostic system of the substrate transfer hand according to claim 1,
- wherein the diagnostic device extracts a contour of the substrate holding part which is contained in the image, from the image information, compares an image of the extracted contour to a pre-stored image of the contour of the substrate holding part in a normal state, and determines whether or not the substrate holding part is in the normal state, based on a deviation amount of the extracted contour from the contour of the substrate holding part in the normal state.

3. The diagnostic system of the substrate transfer hand according to claim 2,
- wherein in a case where the diagnostic device determines that the substrate holding part is not in the normal state, the diagnostic device selects one from pre-stored deformations, based on the deviation amount.

4. The diagnostic system of the substrate transfer hand according to claim 3,
- wherein the diagnostic device determines whether or not to perform correction by modifying a course of the substrate transfer hand, based on the selected deformation and the deviation amount,
- wherein in a case where the diagnostic device determines that the correction can be performed, the diagnostic device calculates a course modification amount and outputs the course modification amount to a control unit of the robot arm, and
- wherein in a case where the diagnostic device determines that the correction cannot be performed, the diagnostic device outputs a stop signal to the control unit of the robot arm.

5. The diagnostic system of the substrate transfer hand according to claim 1,
- wherein the diagnostic device compares an image of the substrate holding part which is contained in the image information to a pre-stored image of the substrate holding part in a normal state, to extract a change between the image of the substrate holding part and the pre-stored image of the substrate holding part, and determines whether or not the substrate holding part is in the normal state, based on the extracted change.

6. A diagnostic system of a substrate transfer hand including a base part coupled to a hand tip portion of a robot arm and a substrate holding part coupled to the base part to hold a substrate, the diagnostic system comprising:
- a reference point pre-defined in a region other than the substrate transfer hand;
- a camera which is secured to the base part and takes an image within a view range including the reference point and the substrate holding part in a state in which the substrate transfer hand is in a specified location and has a specified posture; and
- a diagnostic device which obtains image information of the image taken by the camera and diagnoses normality of the substrate holding part based on the image information,
- wherein the diagnostic device compares the image of the reference point and the substrate holding part which is contained in the image information to an image of the reference point and the substrate holding part which are in a normal state, to extract a change between the images, and determines whether or not there is a change in a position of the camera mounted on the hand with respect to the base part of the hand based on the extracted change.

* * * * *